United States Patent
Yamashita et al.

[11] Patent Number: 6,026,022
[45] Date of Patent: Feb. 15, 2000

[54] NONVOLATILE SEMICONDUCTOR MEMORY DEVICE

[75] Inventors: Kazuyuki Yamashita; Kazuyuki Kusaba, both of Kanagawa, Japan

[73] Assignee: NEC Corporation, Tokyo, Japan

[21] Appl. No.: 09/271,508

[22] Filed: Mar. 18, 1999

[30] Foreign Application Priority Data

Mar. 24, 1998 [JP] Japan ................... 10-075546

[51] Int. Cl.⁷ .................................................. G11C 7/00
[52] U.S. Cl. ................................ 365/185.12; 365/185.29; 365/189.05; 365/218
[58] Field of Search ......................... 365/185.12, 185.29, 365/189.05, 218

[56] References Cited

U.S. PATENT DOCUMENTS

| | | | |
|---|---|---|---|
| 5,469,394 | 11/1995 | Kumakura et al. | 365/185.12 X |
| 5,517,453 | 5/1996 | Strain et al. | 365/185.12 |
| 5,615,149 | 3/1997 | Kobayashi et al. | 365/185.12 |
| 5,768,193 | 6/1998 | Lee et al. | 365/185.12 X |
| 5,896,317 | 4/1999 | Ishii et al. | 365/185.12 X |

FOREIGN PATENT DOCUMENTS

| | | |
|---|---|---|
| 61-276200 | 12/1986 | Japan . |
| 62-084494 | 4/1987 | Japan . |
| 63-251999 | 10/1988 | Japan . |
| 2-146192 | 6/1990 | Japan . |
| 2-226592 | 9/1990 | Japan . |

*Primary Examiner*—Do Hyun Yoo
*Attorney, Agent, or Firm*—Sughrue, Mion, Zinn, Macpeak & Seas, PLLC

[57] ABSTRACT

A nonvolatile semiconductor memory device includes a memory cell array, a plurality of word lines, a plurality of digit lines, a data setting circuit, a write data latch circuit, an X decoder, a write circuit, and a timing control circuit. In the memory cell array, memory cells are arranged in a matrix. Each word line is commonly connected to the memory cells of a corresponding page. Each digit line is commonly connected to the memory cells of a corresponding bit and address. The data setting circuit inverts input data in an erase mode and directly outputs it in a write mode. The write data latch circuit latches data output from the data setting circuit in correspondence with a bit and address designated by an address signal. The X decoder selects a word line corresponding to a page designated by an address signal out of the word lines upon reception of a simultaneous write start signal. The write circuit selects a digit line in accordance with an output from the write data latch circuit upon reception of the simultaneous write start signal. The timing control circuit reads out data in accordance with an external instruction, controls the write and read modes, and outputs the simultaneous write start signal after input data to a plurality of addresses are sequentially latched by the write data latch circuit.

6 Claims, 5 Drawing Sheets

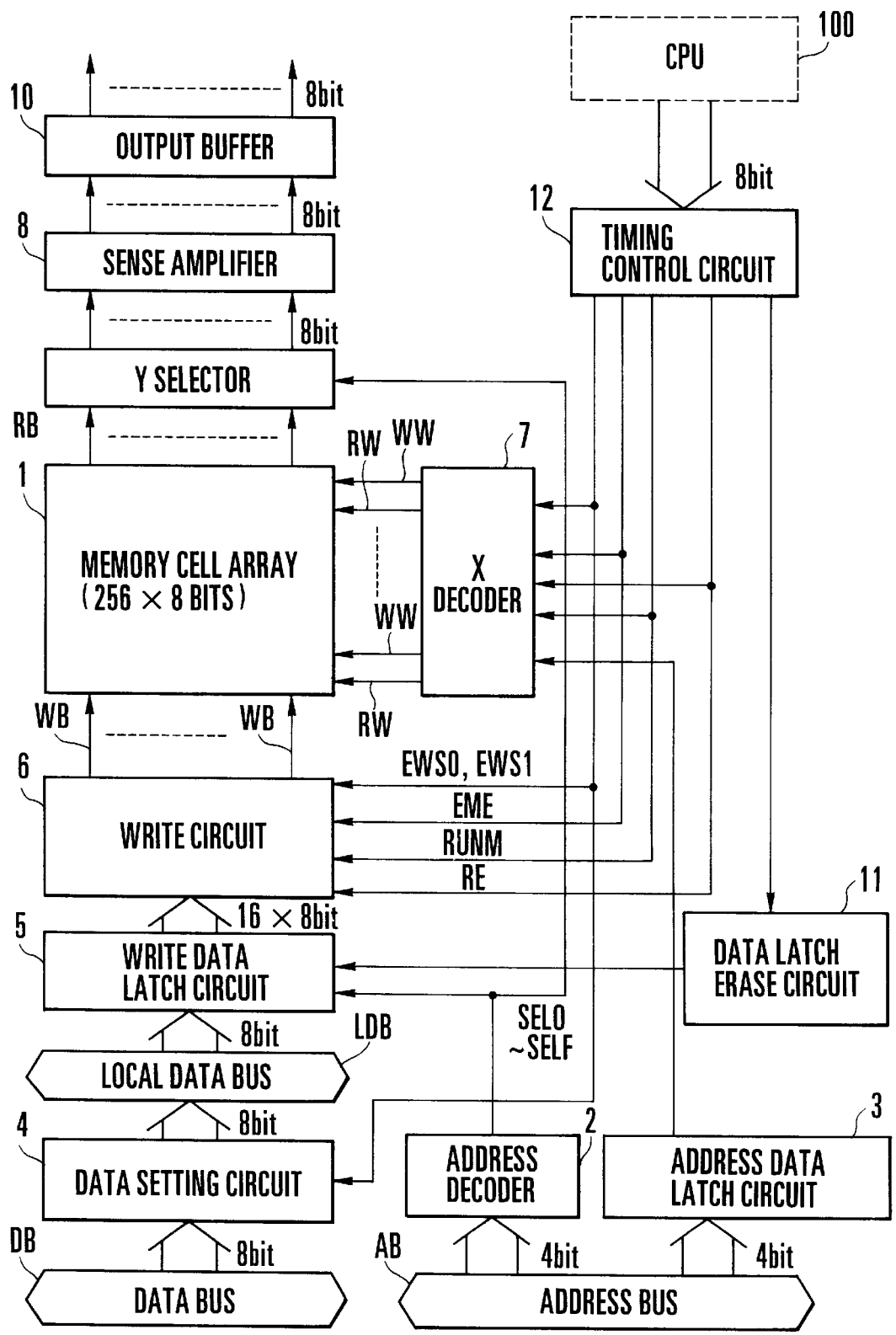
F I G. 1

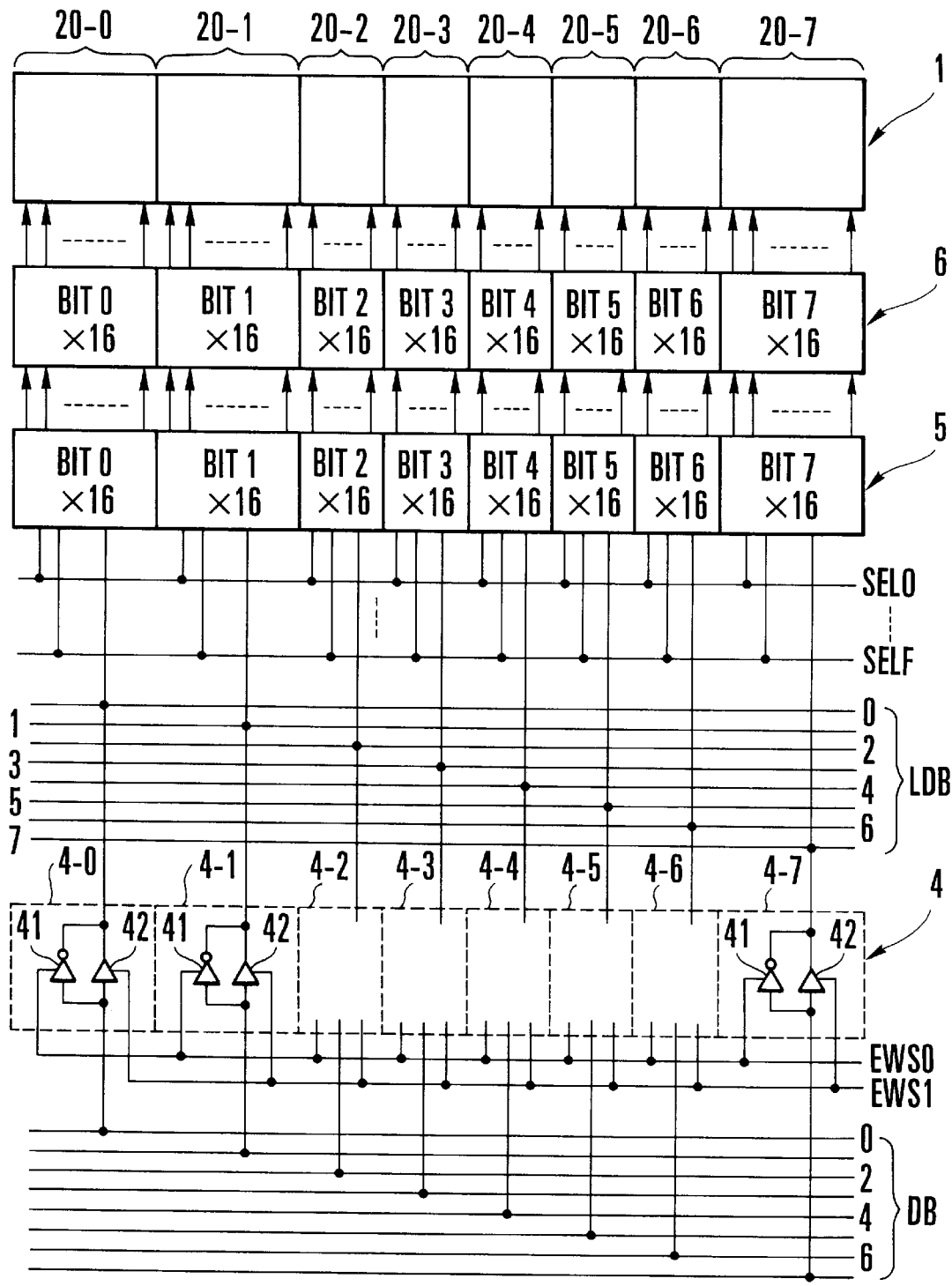
F I G. 3

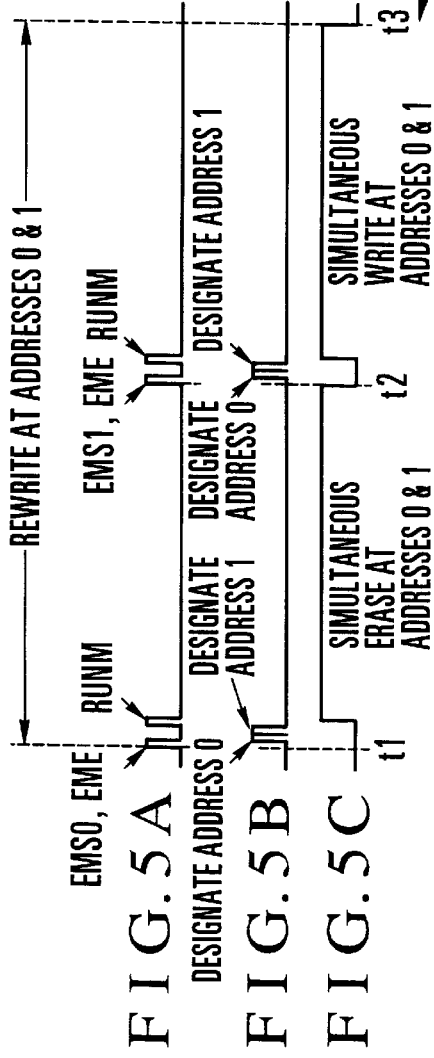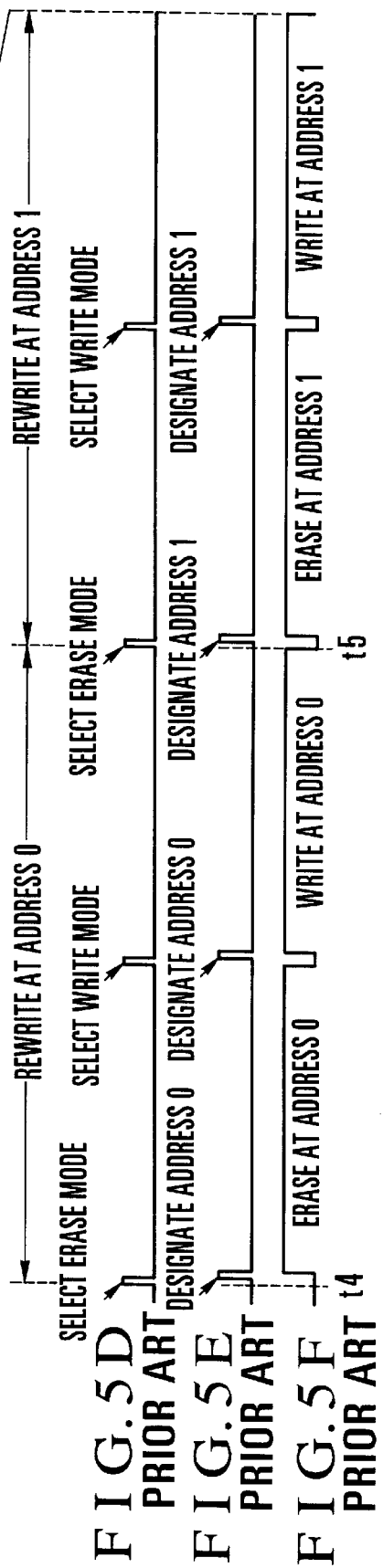
FIG. 5A
FIG. 5B
FIG. 5C
FIG. 5D PRIOR ART
FIG. 5E PRIOR ART
FIG. 5F PRIOR ART

NONVOLATILE SEMICONDUCTOR MEMORY DEVICE

BACKGROUND OF THE INVENTION

The present invention relates to an electrically erasable and programmable nonvolatile semiconductor memory device such as an EEPROM (Electrically Erasable and Programmable Read Only Memory) and, more particularly, to a nonvolatile semiconductor memory device capable of high-speed rewrite processing.

A microcomputer incorporating an EEPROM conventionally rewrites data at an arbitrary address in the EEPROM by erasing and writing data in units of addresses.

A conventional EEPROM write operation will be explained with reference to FIGS. 5A to 5F. Data at a plurality of addresses, e.g., addresses 0 and 1 in the EEPROM can only be rewritten by two rewrite operations (one rewrite operation includes a pair of erase and write) of address 0 at time t4 and address 1 at time t5, as shown in FIGS. 5D, 5E, and 5F.

In a microcomputer incorporating a large-capacity EEPROM, the number of EEPROM rewrite operations is large, and thus the rewrite time for one operation must be suppressed as short as possible.

However, the EEPROM rewrite time is much longer than the normal machine cycle of the microcomputer, so the EEPROM rewrite time is very long in the microcomputer incorporating the conventional EEPROM.

SUMMARY OF THE INVENTION

It is an object of the present invention to provide a nonvolatile semiconductor memory device capable of greatly shortening the rewrite time.

To achieve the above object, according to the present invention, there is provided a nonvolatile semiconductor memory device comprising a memory cell array in which a plurality of memory cells corresponding to pluralities of bits, pages, and addresses are arranged in a matrix, a plurality of word lines each commonly connected to the memory cells of a corresponding page, a plurality of digit lines each commonly connected to the memory cells of a corresponding bit and address, data setting means for inverting input data of a plurality of bits in an erase mode and directly outputting input data in a write mode, data latch means for latching data output from the data setting means in correspondence with a bit and address designated by an address signal, row selection means for selecting a word line corresponding to a page designated by an address signal out of the word lines upon reception of a simultaneous write start signal, write means for selecting a digit line in accordance with an output from the data latch means upon reception of the simultaneous write start signal, and control means for reading out data in accordance with an external instruction, controlling the write and read modes, and outputting the simultaneous write start signal after input data to a plurality of addresses are sequentially latched by the data latch means.

BRIEF DESCRIPTION OF THE DRAWINGS

FIG. 1 is a block diagram showing an EEPROM according to the first embodiment of the present invention;

FIG. 3 is a block diagram showing the detailed arrangement of a data bus, data setting circuit, and local data bus shown in FIG. 1;

FIGS. 5A to 5C are timing charts showing a write operation of the EEPROM in FIG. 1, and FIGS. 5D to 5F are timing charts for explaining a write operation of a conventional EEPROM.

DESCRIPTION OF THE PREFERRED EMBODIMENTS

Figure 2A:
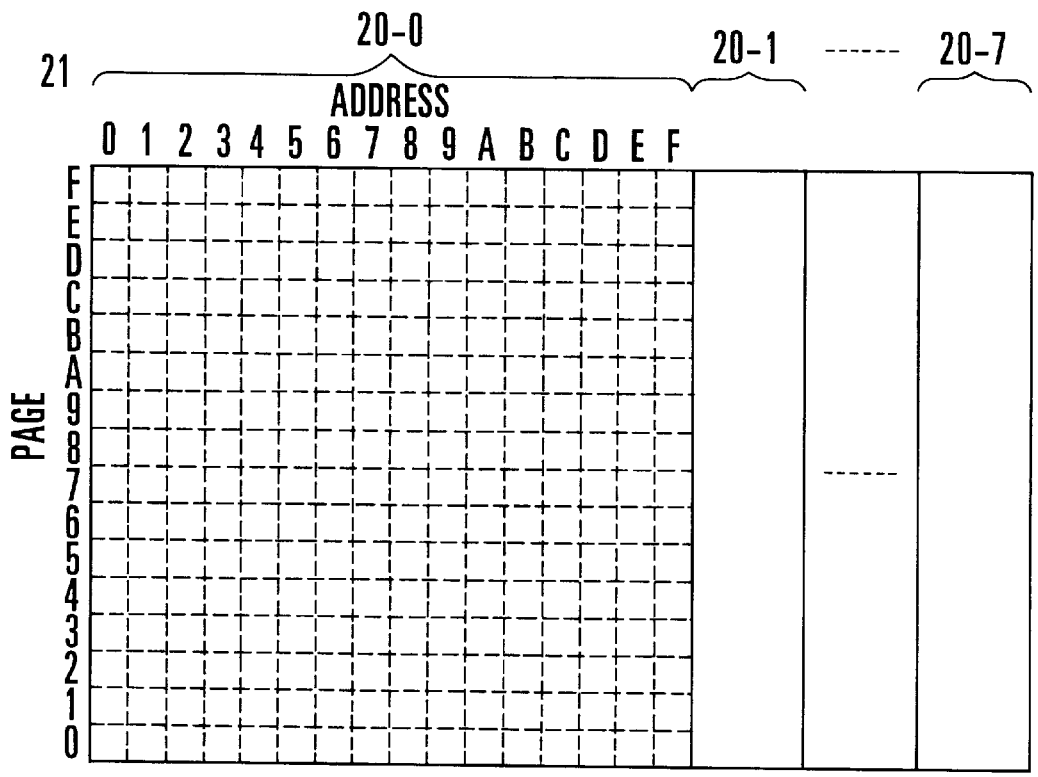
FIG. 2A is a block diagram showing a memory cell array shown in FIG. 1.

The present invention will be described in detail below with reference to the accompanying drawings.

[First Embodiment]

FIG. 1 shows an EEPROM according to the first embodiment of the present invention.

In FIG. 1, the EEPROM of the first embodiment comprises a memory cell array 1 formed by arranging a plurality of memory cells in a matrix, an address decoder 2 for outputting address selection signals SEL0 to SELF for designating one of addresses 0 to F (hexadecimal) in accordance with lower 4 bits of an 8-bit address signal input to an address bus AB, an address data latch circuit 3 for latching upper 4 bits of the 8-bit address signal input to the address bus AB, a data setting circuit 4 for, in an erase mode, inverting 8-bit data input to a data bus DB and outputting the inverted data to a local data bus LDB, and in a write mode, directly outputting 8-bit data to the local data bus LDB, and a write data latch circuit 5 for latching data output from the data setting circuit 4 via the local data bus LDB to a latch circuit at an address designated by the address selection signal SEL.

The EEPROM further comprises a write circuit 6 for setting one of a plurality of write digit lines WB which corresponds to an address at which data "1" is written in the write data latch circuit 5, to a selection level, and an X decoder 7 for setting a write or read word line of a plurality of write digit lines WW or RW which corresponds to a page designated by a 4-bit address signal output from the address data latch circuit 3, to a selection level.

The EEPROM further comprises a sense amplifier 8 for amplifying memory information of an 8-bit memory cell, a Y selector 9 for selecting one of a plurality of read digit lines RB in accordance with the address selection signals SEL0 to SELF and connecting the selected line to the sense amplifier 8, an output buffer 10 for externally outputting 8-bit data output from the sense amplifier 8, a data latch erase circuit 11 for clearing all data in the write data latch circuit 5 at the same time as the completion of an erase and write, and a timing control circuit 12 for generating various control signals in accordance with externally input instructions.

FIG. 2A shows the schematic arrangement of the memory cell array 1 in FIG. 1. Note that the EEPROM of the first embodiment is a memory capable of processing 8-bit input/output data at once. In FIG. 2A, the memory cell array 1 is divided into eight memory blocks 20-0 to 20-7 corresponding to respective bits 0 to 7. The memory blocks 20-0 to 20-7 have the same arrangement.

Each of the memory blocks 20-0 to 20-7 has a matrix of 16 (along the vertical direction corresponding to pages 0 to F; hexadecimal)×16 (along the horizontal direction corresponding to addresses 0 to F; hexadecimal) memory cells 21. In this case, the memory cell array 1 has a capacity of 256×8 bits.

Figure 2B:
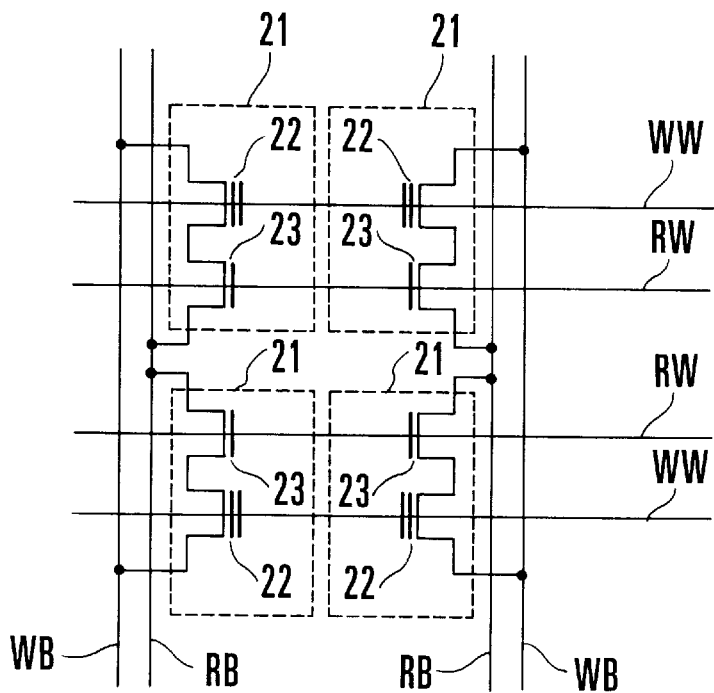
FIG. 2B is a circuit diagram showing the memory cell array shown in FIG. 2A.

FIG. 2B shows the detailed arrangement of the memory cell 21 in FIG. 2A. FIG. 2B shows the arrangement of 2 pages (along the vertical direction)×2 addresses (along the horizontal direction) in the memory cell array 1 in FIG. 2A.

Each memory cell 21 is made up of one memory cell transistor 22 and one n-channel MOS transistor 23.

The control gates of the memory cell transistors 22 on respective rows corresponding to pages 0 to F (hexadecimal) are connected to the write word lines WW arranged in units of rows. The gates of the n-channel transistors 23 on respective rows are connected to the read word lines RW arranged in units of rows. Note that the numbers of write and read word lines WW and RW arranged in correspondence with pages 0 to F are 16 each.

The memory cell transistors 22 on respective columns corresponding to addresses 0 to F (hexadecimal) have drains connected to the write digit lines WB arranged in units of columns, and sources connected to the drains of the n-channel MOS transistors 23 on the same columns. The sources of the n-channel MOS transistor 23 on respective columns are connected to the read digit lines RB arranged in units of columns. Note that the numbers of write and read digit lines WB and RB arranged in correspondence with bits 0 to 7 and addresses 0 to F are 8×16=128 each.

Table 1 shows the operating voltages of the write word line WW, read word line RW, write digit line WB, and read digit line RB in the erase, write, and read modes. In Table 1, the left of "/" represents a selection voltage level, and the right of "/" represents a non-selection voltage level. VCC is a power supply voltage of about 5 V, VPP is a relatively high voltage of about 10 V, V1 is ½ VPP, and V2 is a relatively low voltage of about 1 V.

TABLE 1

|  | Write Word Line WW | Read Word Line RW | Write Digit Line WB | Read Digit Line RB |
| --- | --- | --- | --- | --- |
| Erase | 0 V/V1 | V1/V1 | VPP/V1 | Floating |
| Write | VPP/V1 | 0 V | 0 V/V1 | Floating |
| Read | 0 V | VCC/0 V | 0 V | V2 |

In the erase mode, 0 V is applied to a selected one of the write word lines WW, ½ VPP is applied to unselected write word lines, and ½ VPP is applied to all the read word lines RW. At the same time, the high voltage VPP is applied to a selected one of the write digit lines WB, and ½ VPP is applied to unselected write digit lines. All the read digit lines RB are set to a floating (open) state.

Then, 0 V and the high voltage VPP are respectively applied to the control gate and drain of a memory cell transistor selected by the selected write word and digit lines out of the memory cell transistors 22 of the memory cell array 1.

As a result, a high electric field is generated between the drain and floating gate of the selected memory cell transistor to discharge electrons in the floating gate to the drain by the tunnel phenomenon, thereby decreasing the threshold voltage of the selected memory cell transistor. In this manner, data "1" is erased (data "0" is written).

In the write mode, the high voltage VPP is applied to a selected one of the write word lines WW, ½ VPP is applied to unselected write word lines, and 0 V is applied to all the read word lines RW. At the same time, 0 V is applied to a selected one of the write digit lines WB, and ½ VPP is applied to unselected write digit lines. All the read digit lines RB are set to a floating (open) state.

The high voltage VPP and 0 V are respectively applied to the control gate and drain of a memory cell transistor selected from the memory cell transistors 22 of the memory cell array 1 by the selected write word and digit lines.

As a result, a high electric field is generated between the floating gate and drain of the selected memory cell transistor to inject electrons to the floating gate by the tunnel phenomenon, thereby increasing the threshold voltage of the selected memory cell transistor. In this manner, data "1" is written.

In the read mode, the power supply voltage VCC is applied to a selected one of the read word lines RW, and 0 V is applied to unselected read word lines. An n-channel MOS transistor 23 selected by the selected read word line is turned on.

Then, the potential of the read digit line RB changes in accordance with the electron amount in the floating gate of the selected memory cell transistor, thereby reading out memory information of the memory cell 21.

The address decoder 2 outputs the address selection signals SEL0 to SELF for designating one of addresses 0 to F (hexadecimal) to the write data latch circuit 5 and Y selector 9 in accordance with lower 4 bits of an 8-bit address signal input to the address bus AB from outside the EEPROM. The address data latch circuit 3 latches and outputs, to the X decoder, upper 4 bits of the 8-bit address signal externally input to the address bus AB.

In the erase mode, the data setting circuit 4 for setting data "1" in the write data latch circuit 5 inverts and outputs, to the local data bus LDB, 8-bit data externally input to the data bus DB in accordance with write/erase mode selection signals EWS0 and EWS1. In the write mode, the data setting circuit 4 directly outputs 8-bit data to the local data bus LDB.

FIG. 3 shows the detailed arrangement of the data bus DB, data setting circuit 4, and local data bus LDB shown in FIG. 1.

In FIG. 3, the data setting circuit 4 is constituted by bit setting circuits 4-0 to 4-7 arranged in units of bits 0 to 7. Each of the bit setting circuits 4-0 to 4-7 is made up of an inverter 41 having an input connected to the data bus DB, an output connected to the local data bus LDB, and a control input for receiving the write/erase mode selection signal EWS0, and a buffer 42 having an input connected to the data bus DB, an output connected to the local data bus LDB, and a control input for receiving the write/erase mode selection signal EWS1. The bit setting circuits 4-0 to 4-7 have the same arrangement.

The inverter 41 and buffer 42 of the data setting circuit 4-0 corresponding to bit 0 have inputs connected to bit 0 of the data bus DB, and outputs connected to bit 0 of the local data bus LDB.

The inverter 41 and buffer 42 of the data setting circuit 4-1 corresponding to bit 1 have inputs connected to bit 1 of the data bus DB, and outputs connected to bit 1 of the local data bus LDB.

Similarly, the inverters 41 and buffers 42 of the data setting circuits 4-2, 4-3, 4-4, 4-5, 4-6, and 4-7 corresponding to bits 2, 3, 4, 5, 6, and 7 have inputs connected to bits 2, 3, 4, 5, 6, and 7 of the data bus DB, and outputs connected to bits 2, 3, 4, 5, 6, and 7 of the local data bus LDB.

Each inverter 41 is set to an enable state by an active ("H"-level) write/erase mode selection signal EWS0 and to a disable state by an "L"-level write/erase mode selection signal EWS0. Each buffer 42 is set to an enable state by an active ("H"-level) write/erase mode selection signal EWS1 and to a disable state by an "L"-level write/erase mode selection signal EWS1.

When the write/erase mode selection signal EWS0 becomes active to designate the erase mode, the data setting circuit 4 inverts and outputs 8-bit data input to the data bus DB to the local data bus LDB. When the write/erase mode selection signal EWS1 becomes active to designate the write mode, the data setting circuit 4 directly outputs 8-bit data input to the data bus DB to the local data bus LDB.

Figure 4:
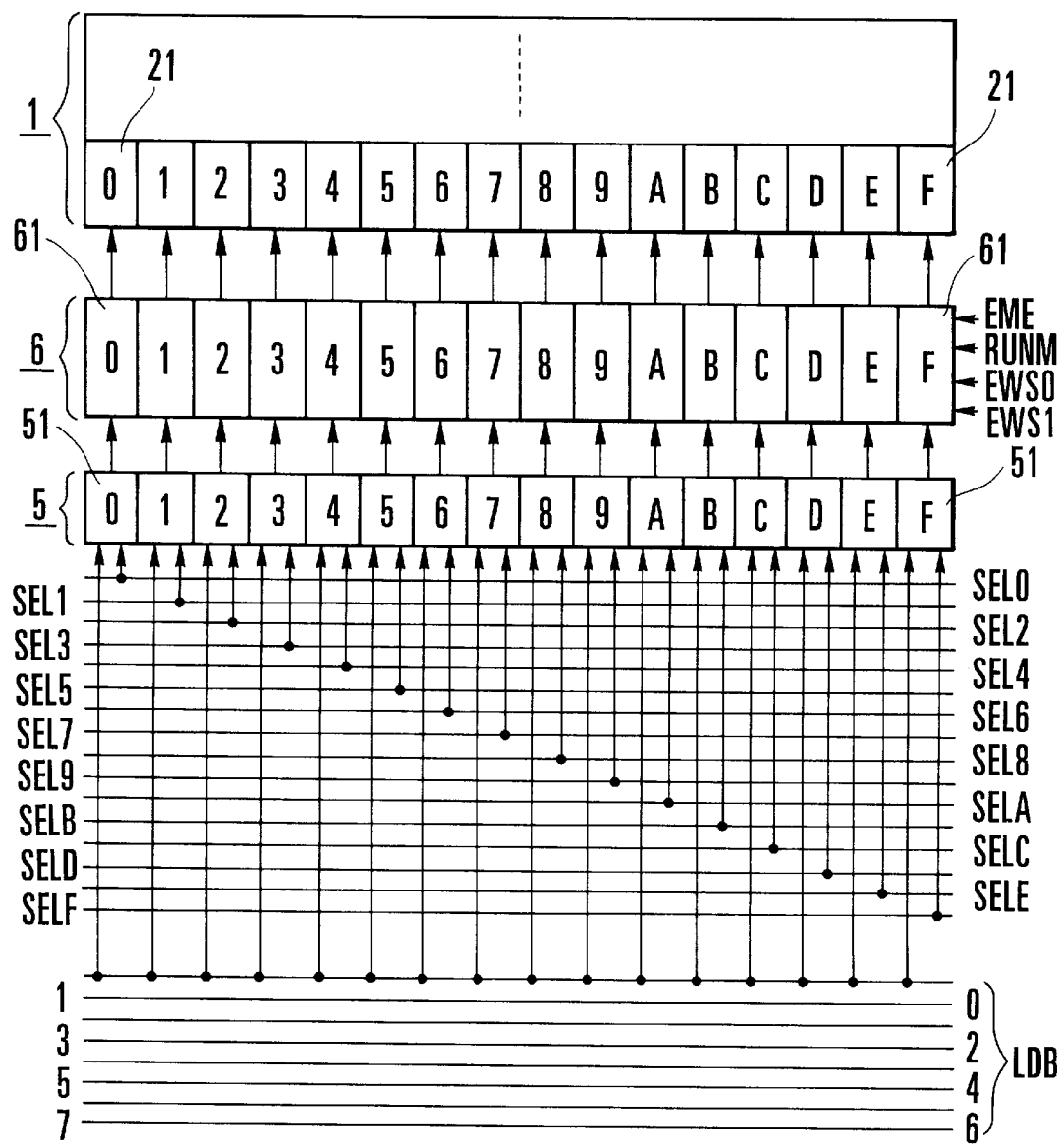
FIG. 4 is a block diagram showing the detailed arrangement of a local data bus and write data latch circuit shown in FIG. 1.

FIG. 4 shows the detailed arrangement of the write data latch circuit 5 and write circuit 6. FIG. 4 shows only an arrangement corresponding to bit 0 out of bits 0 to 7.

The write data latch circuits 5 are arranged in units of bits 0 to 7. As shown in FIG. 4, the write data latch circuit 5 for one bit is made up of 16 latch circuits 51 corresponding to addresses 0 to F (hexadecimal).

The data input of each latch circuit 51 is connected to a corresponding bit of the local data bus LDB. In FIG. 4, the data input of each latch circuit 51 of a write data latch circuit 5 corresponding to bit 0 is connected to bit 0 of the local data bus LDB.

The data input of each latch circuit 51 of a write data latch circuit 5 corresponding to bit 1 is connected to bit 1 of the local data bus LDB. Similarly, the data inputs of latch circuits 51 of write data latch circuits 5 corresponding to bits 2, 3, 4, 5, 6, and 7 are respectively connected to bits 2, 3, 4, 5, 6, and 7 of the local data bus LDB.

The clock inputs of the latch circuits 51 are respectively connected to the address selection signals SEL0 to SELF for designating corresponding addresses. In FIG. 4, the clock input of a latch circuit 51 corresponding to address 0 is connected to the address selection signal SEL0. The clock input of a latch circuit 51 corresponding to address 1 is connected to the address selection signal SEL1.

Similarly, the clock inputs of latch circuits 51 corresponding to addresses 2, 3, 4, 5, 6, 7, 8, 9, A, B, C, D, E, and F are respectively connected to the address selection signals SEL2, SEL3, SEL4, SEL5, SEL6, SEL7, SEL8, SEL9, SELA, SELB, SELC, SELD, SELE, and SELF.

When the clock input becomes active ("H" level), each latch circuit 51 latches and outputs a value input to the data input. At this time, the latch circuit 51 keeps latching the data until the completion of an erase or write.

The write circuits 6 are arranged in units of bits 0 to 7. As shown in FIG. 4, the write circuit 6 for one bit is made up of 16 level shifters 61 corresponding to addresses 0 to F (hexadecimal). The level shifters 61 constitute a voltage generation circuit.

The input of each level shifter 61 is connected to the output of a latch circuit 51 at a corresponding bit and address. For example, the input of a level shifter 61 corresponding to bit 0 and address 0 is connected to the output of a latch circuit 51 corresponding to bit 0 and address 0.

The output of each level shifter 61 is connected to write and read digit lines WB and RB at a corresponding bit and address. For example, the input of a level shifter 61 corresponding to bit 0 and address 0 is connected to the write and read digit lines WB and RB corresponding to bit 0 and address 0.

When simultaneous write enable and start signals EME and RUNM are active and an output from a corresponding latch circuit 51 is "1", the level shifter 61 sets the connected write digit line WB to a selection level. The value of the selection level is determined in accordance with the write/erase mode selection signals EWS0 and EWS1.

Referring back to FIG. 1, the X decoder 7 sets one of the 16 write word lines WW corresponding to pages 0 to F (hexadecimal) or one of the read word lines RW corresponding to pages 0 to F to a selection level in accordance with a 4-bit address signal output from the address data latch circuit 3. Similar to the write circuit 6, the value of the selection level is determined in accordance with the write/erase mode selection signals EWS0 and EWS1.

The sense amplifier 8 arranged in units of bits 0 to 7 detects and amplifies memory information of the memory cell 21. The Y selector 9 arranged in units of bits 0 to 7 selects one of the 16 read digit lines RB corresponding to addresses 0 to F in accordance with the address selection signals SEL0 to SELF, and connects the selected read digit line to a corresponding sense amplifier 8. For example, a Y selector 9 corresponding to bit 0 connects a selected read digit line to a sense amplifier 8 corresponding to bit 0. A Y selector 9 corresponding to bit 1 connects a selected read digit line to a sense amplifier 8 corresponding to bit 1.

The output buffer 10 outputs 8-bit data output from the sense amplifiers 8 to outside the EEPROM. The data latch erase circuit 11 clears all data of the write data latch circuits 5 at the same time as the completion of an erase and write, i.e., sets all data of the write data latch circuits 5 to "0".

The timing control circuit 12 generates control signals such as the simultaneous write enable signal EME for permitting a simultaneous write, the write/erase mode selection signals EWS0 and EWS1 representing the erase or write mode, and the simultaneous write start signal RUNM representing the start of a simultaneous write in accordance with an instruction input from a CPU (Central Processing Unit) 100 outside the EEPROM.

A write operation to addresses 0 and 1 of page 2 in the EEPROM having this arrangement will be explained with reference to FIGS. 5A to 5F.

Upon reception of an instruction designating a simultaneous erase from the external CPU 100, the timing control circuit 12 sets the write/erase mode selection signal EWS0 to an active state ("H" level) to designate the erase mode. At the same time, the timing control circuit 12 sets the simultaneous write enable signal EME to an active state ("H" level) to designate a simultaneous write (time t1 in FIG. 5A). At this time, the write/erase mode selection signal EWS1 is kept at "L" level.

An address signal designating address 0 of page 2 is input from outside the EEPROM to the address bus AB, and data "0" is input to all bits 0 to 7 of the data bus DB (FIG. 5B). Since the write/erase mode selection signal EWS0 is active, the inverters 41 and buffers 42 respectively change to enable and disable states in the data setting circuits 4-0 to 4-7 corresponding to bits 0 to 7.

Accordingly, the data setting circuits 4-0 to 4-7 of the data setting circuit 4 invert respective bit data of the data bus DB and output them to corresponding bits of the local data bus LDB. Since data "0" has been input to all bits 0 to 7 of the data bus DB, data "1" is output to all bits 0 to 7 of the local data bus LDB.

Each write data latch circuit 5 latches data output from the data setting circuit 4 to the local data bus LDB in a latch circuit 51 at an address designated by the address selection signal SEL. Since the address signal designating address 0 of page 2 has been input to the address bus AB, the address decoder 2 sets only the address selection signal SEL0 designating address 0 to an active state ("H"), and sets the remaining address selection signals SEL1 to SELF to "L" level.

In the write data latch circuits 5 corresponding to bits 0 to 7, each latch circuit 51 corresponding to address 0 latches data "1" output to a corresponding bit of the local data bus LDB.

Similarly, an address signal designating address 1 of page 2 is externally input to the address bus AB, and data "0" is input to all bits 0 to 7 of the data bus DB (FIG. 5B).

Since the write/erase mode selection signal EWS0 is active, the data setting circuits 4-0 to 4-7 corresponding to bits 0 to 7 invert respective bits of the data bus DB and output them to corresponding bits of the local data bus LDB. Then, data "1" is output to all bits 0 to 7 of the local data bus LDB.

Since the address signal designating address 1 of page 2 has been input to the address bus AB, the address decoder 2 sets only the address selection signal SEL1 designating address 1 to an active state ("H" level), and sets the remaining address selection signals SEL0 and SEL2 to SELF to "L" level.

In the write data latch circuits 5 corresponding to bits 0 to 7, each latch circuit 51 corresponding to address 1 latches data "1" output to a corresponding bit of the local data bus LDB. In this way, in the write data latch circuits 5 corresponding to bits 0 to 7, latch circuits 51 corresponding to addresses 0 and 1 latch and output data "1". The remaining latch circuits 51 do not latch data "1" and thus output "0".

Subsequently, the timing control circuit 12 externally receives an instruction designating the start of a simultaneous write. The timing control circuit 12 sets the simultaneous write start signal RUNM to an active state ("H" level) to designate the start of a simultaneous write (FIG. 5A).

When the simultaneous write start signal RUNM becomes active while the simultaneous write enable signal EME and write/erase mode selection signal EWS0 are active, the write circuits 6 corresponding to bits 0 to 7 set a write digit line corresponding to an address at which an output from the write data latch circuit 5 is "1" to a selection level (high voltage VPP) out of the 16 write digit lines WB corresponding to addresses 0 to F. The write circuits 6 set a write digit line corresponding to an address at which an output from the write data latch circuit 5 is "0" to a non-selection level (½ VPP).

Since latch circuits 51 corresponding to addresses 0 and 1 have latched data "1" in each write data latch circuit 5, write digit lines WB corresponding to addresses 0 and 1 change to a selection level. All the read digit lines RB are in a floating state.

When the simultaneous write start signal RUNM becomes active while the simultaneous write enable signal EME and write/erase mode selection signal EWS0 are active, the X decoder 7 sets a write word line corresponding to a page designated by an address signal from the address data latch circuit 3, to a selection level (0 V) out of the 16 write word lines WW corresponding to pages 0 to F. The X decoder 7 sets the remaining write word lines to a non-selection level (½ VPP) and all the read word lines RW to ½ VPP.

Since the address signal designating page 2 has been input to the address bus AB, a write word line WW corresponding to page 2 changes to a selection level. Consequently, 0 V and the high voltage VPP are respectively applied to the control gates and drains of memory cell transistors 22 of memory cells 21 corresponding to bits 0 to 7, page 2, and addresses 0 and 1 out of the memory cells 21 of the memory cell array 1. In this way, data at addresses 0 and 1 of page 2 are simultaneously erased (FIG. 5C).

The data latch erase circuit 11 changes all data of the write data latch circuits 5 to "0" at the same time as the completion of an erase under the control of the timing control circuit 12.

Upon reception of an instruction designating a simultaneous write from the CPU 100 outside the EEPROM, the timing control circuit 12 sets the write/erase mode selection signal EWS1 to an active state ("H" level) to designate the write mode. At the same time, the timing control circuit 12 sets the simultaneous write enable signal EME to an active state ("H" level) to designate a simultaneous write (time t2 in FIG. 5A). Note that the timing control circuit 12 keeps the write/erase mode selection signal EWS0 at "L" level.

An address signal designating address 0 of page 2 is input from outside the EEPROM to the address bus AB, and 8-bit data to be written at address 0 of page 2 is input to the data bus DB (FIG. 5B).

Since the write/erase mode selection signal EWS1 is active, the buffers 42 and inverters 41 of the data setting circuits 4-0 to 4-7 corresponding to bits 0 to 7 respectively change to enable and disable states. Accordingly, the data setting circuit 4 directly outputs respective bit data of the data bus DB to corresponding bits of the local data bus LDB.

Each write data latch circuit 5 latches data output from the data setting circuit 4 to the local data bus LDB in a latch circuit 51 at an address designated by the address selection signal SEL.

Since the address signal designating address 0 of page 2 has been input to the address bus AB, the address decoder 2 sets only the address selection signal SEL0 designating address 0 to an active state ("H"), and sets the remaining address selection signals SEL1 to SELF to "L" level. In the write data latch circuits 5 corresponding to bits 0 to 7, each latch circuit 51 corresponding to address 0 latches data output to a corresponding bit of the local data bus LDB.

An address signal designating address 1 of page 2 is externally input to the address bus AB, and 8-bit data to be written at address 1 of page 2 is input to the data bus DB (FIG. 5B).

Since the write/erase mode selection signal EWS1 is active, the data setting circuits 4-0 to 4-7 corresponding to bits 0 to 7 directly output respective bit data of the data bus DB to corresponding bits of the local data bus LDB.

Since the address signal designating address 1 of page 2 has been input to the address bus AB, the address decoder 2 sets only the address selection signal SEL1 designating address 1 to an active state ("H" level), and sets the remaining address selection signals SEL0 and SEL2 to SELF to "L" level.

In the write data latch circuits 5 corresponding to bits 0 to 7, each latch circuit 51 corresponding to address 1 latches data output to a corresponding bit of the local data bus LDB. Then, in the write data latch circuits 5 corresponding to bits 0 to 7, each latch circuit 51 corresponding to address 0 latches data to be written at address 0, and each latch circuit 51 a corresponding to address 1 latches data to be written at address 1.

Subsequently, the timing control circuit 12 externally receives an instruction designating the start of a simultaneous write. The timing control circuit 12 sets the simultaneous write start signal RUNM to an active state ("H" level) to designate the start of a simultaneous write (FIG. 5A).

When the simultaneous write start signal RUNM becomes active while the simultaneous write enable signal EME and write/erase mode selection signal EWS1 are active, the write circuits 6 corresponding to bits 0 to 7 set a write digit line corresponding to an address at which an output from the write data latch circuit 5 is "1" to a selection level (0 V) out of the 16 write digit lines WB corresponding to addresses 0 to F. The write circuits 6 set a write digit line corresponding to an address at which an output from the write data latch circuit 5 is "0" to a non-selection level (½ VPP).

Since each write data latch circuit 5 has latched data to be written at addresses 0 and 1, a latch circuit 51 which latches write data "1" outputs "1", and a latch circuit 51 which latches write data "0" outputs "0". Therefore, a write digit line WB corresponding to a bit at which the value of write data is "1" changes to a selection level out of write digit lines WB corresponding to addresses 0 and 1. All the read digit lines RB are in a floating state.

When the simultaneous write start signal RUNM becomes active while the simultaneous write enable signal EME and write/erase mode selection signal EWS1 are active, the X decoder 7 sets a write word line corresponding to a page designated by an address signal from the address data latch circuit 3, to a selection level (high voltage VPP) out of the 16 write word lines WW corresponding to pages 0 to F. The X decoder 7 sets the remaining write word lines to a non-selection level (½ VPP) and all the read word lines RW to 0 V.

Since the address signal designating page 2 has been input to the address bus AB, a write word line WW corresponding to page 2 changes to a selection level. Consequently, the high voltage VPP and 0 V are respectively applied to the control gate and drain of a memory cell transistor 22 of a memory cell 21 corresponding to page 2, address 0, and a bit at which the value of data to be written at address 0 is "1", out of the memory cells 21 of the memory cell array 1.

At the same time, the high voltage VPP and 0 V are respectively applied to the control gate and drain of a memory cell transistor 22 of a memory cell 21 corresponding to page 2, address 1, and a bit at which the value of data to be written at address 1 is "1". As a result, data are simultaneously written at addresses 0 and 1 of page 2 (FIG. 5C).

The data latch erase circuit 11 changes all data of the write data latch circuits 5 to "0" at the same time as the completion of a write under the control of the timing control circuit 12. As described above, according to the first embodiment, data can be simultaneously rewritten with respect to memory cells 21 at a plurality of addresses.

The rewrite time (time interval between t1 and t3) for one operation is longer than the conventional rewrite time (time interval between t4 and t5) by a time required to sequentially transferring, to the write data latch circuit 5, data corresponding to input data to a plurality of addresses. However, this transfer time is much shorter than an actual erase/write time with respect to the memory cell 21 (time required to complete an erase/write after the simultaneous write start signal RUNM becomes active).

Data can therefore be rewritten at a plurality of addresses within almost the same time as the conventional data rewrite time for one address, thereby greatly shortening the rewrite time.

Data is erased/written by selecting only a memory cell 21 at an address corresponding to a latch circuit 51 of the write data latch circuit 5 in which data "1" is written, whereas no data is erased/written in a memory cell 21 at an address corresponding to a latch circuit 51 in which data "0" is written. This can decrease the number of rewrite operations with respect to the memory cell 21 and increase the service life of the memory cell 21.

In the first embodiment, a rewrite is simultaneously performed at addresses 0 and 1 of page 2. Further, a rewrite can also be simultaneously performed at three or more addresses. In this case, data is repeatedly written in the write data latch circuit 5 by repeatedly inputting an address signal to the address bus AB and data to the data bus DB. After data corresponding to a desired number of addresses are transferred to the write data latch circuit 5, the simultaneous write start signal RUNM is set active.

The first embodiment has exemplified a simultaneous write in which a rewrite is simultaneously performed at a plurality of addresses, but a byte rewrite can also be performed for each address. This byte rewrite operation will be explained.

Upon reception of an instruction designating a byte erase from the external CPU 100, the timing control circuit 12 sets the write/erase mode selection signal EWS0 active to designate the erase mode (t4 in FIG. 5D). At this time, the simultaneous write enable signal EME is kept at "L" level.

An address signal designating address 0 of page 2 is input from outside the EEPROM to the address bus AB, and data "0" is input to all bits 0 to 7 of the data bus DB (FIG. 5E).

Since the write/erase mode selection signal EWS0 is active, the data setting circuit 4 inverts respective bit data of the data bus DB and outputs them to corresponding bits of the local data bus LDB. In the write data latch circuits 5 corresponding to bits 0 to 7, each latch circuit 51 corresponding to address 0 latches data "1" output to a corresponding bit of the local data bus LDB.

When the simultaneous write enable signal EME is at "L" level, each write circuit 6 sets a write digit line corresponding to an address at which an output from the write data latch circuit 5 is "1" to a selection level (high voltage VPP) a predetermined time after the write/erase mode selection signal EWS0 becomes active. The write circuit 6 sets a write digit line corresponding to an address at which an output from the write data latch circuit 5 is "0" to a non-selection level (½ VPP). In this case, write digit lines WB corresponding to address 0 in bits 0 to 7 change to the selection level.

When the simultaneous write enable signal EME is at "L" level, the X decoder 7 sets a write word line corresponding to a page designated by an address signal from the address data latch circuit 3, to a selection level (0 V) a predetermined time after the write/erase mode selection signal EWS0 becomes active. The X decoder 7 sets the remaining write word lines to a non-selection level (½ VPP) and all the read word lines RW to ½ VPP level. In this case, a write word line WW corresponding to page 2 changes to the selection level.

Accordingly, 0 V and the high voltage VPP are respectively applied to the control gates and drains of memory cell transistors 22 of memory cells 21 corresponding to bits 0 to 7, page 2, and address 0 out of the memory cells 21 of the memory cell array 1. Thus, data at address 0 of page 2 are erased.

The data latch erase circuit 11 changes all data of the write data latch circuits 5 to "0" at the same time as the completion of an erase under the control of the timing control circuit 12.

Upon reception of an instruction designating a byte write from the CPU 100 outside the EEPROM, the timing control circuit 12 sets the write/erase mode selection signal EWS1 active to designate the write mode (FIG. 5D). At this time, the simultaneous write enable signal EME is kept at "L" level.

An address signal designating address 0 of page 2 is input from outside the EEPROM to the address bus AB, and 8-bit data to be written at address 0 of page 2 is input to the data bus DB (FIG. 5B).

Since the write/erase mode selection signal EWS1 is active, the data setting circuit 4 directly outputs respective bit data of the data bus DB to corresponding bits of the local data bus LDB. In the write data latch circuits 5 corresponding to bits 0 to 7, each latch circuit 51 corresponding to address 0 latches data output to a corresponding bit of the local data bus LDB.

When the simultaneous write enable signal EME is at "L" level, each write circuit 6 sets a write digit line corresponding to an address at which an output from the write data latch circuit 5 is "0" to a selection level (0 V) a predetermined time after the write/erase mode selection signal EWS1 becomes active. The write circuit 6 sets a write digit line corresponding to an address at which an output from the write data latch circuit 5 is "0" to a non-selection level (½ VPP). In this case, write digit lines WB corresponding to address 0 in bits 0 to 7 change to the selection level.

When the simultaneous write enable signal EME is at "L" level, the X decoder 7 sets a write word line corresponding to a page designated by an address signal from the address data latch circuit 3 to a selection level (high voltage VPP) a predetermined time after the write/erase mode selection signal EWS1 becomes active. The X decoder 7 sets the remaining write word lines to a non-selection level (½ VPP) and all the read word lines RW to 0 V. In this case, a write word line WW corresponding to page 2 changes to the selection level.

The high voltage VPP and 0 V are respectively applied to the control gate and drain of a memory cell transistor 22 of a memory cell 21 corresponding to page 2, address 0, and a bit at which the value of data to be written at address 0 is "1" out of the memory cells 21 of the memory cell array 1. Consequently, data is written at address 0 of page 2.

The data latch erase circuit 11 changes all data of the write data latch circuits 5 to "0" at the same time as the completion of a write under the control of the timing control circuit 12. In this fashion, data can be rewritten in units of bytes.

[Second Embodiment]

Although data is rewritten in the EEPROM by sequentially erasing and writing data in the first embodiment, data can also be rewritten in the EEPROM by only an erase or write. The second embodiment will be described with reference to FIGS. 1 to 4.

In the second embodiment, a CPU 100 gives the EEPROM an instruction designating a read. Upon reception of the read instruction from the CPU 100, a timing control circuit 12 sets a read mode selection signal RE active to designate the read mode.

An address signal designating address 0 of page 2 is input from the CPU 100 to an address bus AB. An address decoder 2 sets only an address selection signal SEL0 designating address 0 to an active state ("H"), and sets remaining address selection signals SEL1 to SELF to "L" level.

When the read mode selection signal RE becomes active, each write circuit 6 changes all write digit lines WB to 0 V, and applies a voltage V2 to read digit lines RB to perform precharge.

When the read mode selection signal RE becomes active, an X decoder 7 sets a read word line corresponding to a page designated by an address signal from an address data latch circuit 3, to a selection level (power supply voltage VCC) out of 16 read word lines RW corresponding to pages 0 to F. The X decoder 7 sets the remaining read word lines to a non-selection level (0 V) and all write word lines WW to 0 V. As a result, memory information of a selected memory cell 21 is output to the read digit line RB.

Y selectors 9 arranged in units of bits 0 to 7 connect read digit lines RB corresponding to address 0 to sense amplifiers 8 in accordance with the address selection signals SEL0 to SELF. Then, data at address 0 of page 2 is externally output via an output buffer 10.

The CPU 100 gives the EEPROM an address signal designating address 1 of page 2 and an instruction designating a read, thereby reading out data at address 1 of page 2. The CPU 100 compares the data read out from address 0 of page 2 with data to be written at address 0 of page 2. Further, the CPU 100 compares the data read out from address 1 of page 2 with data to be written at address 1 of page 2.

When data to be written at address 0 of page 2 represents only a rewrite from "1" to "0" with respect to current data stored at address 0 of page 2 (i.e., data read out from address 0 of page 2), and data to be written at address 1 of page 2 represents only a rewrite from "1" to "0" with respect to current data stored at address 1 of page 2 (i.e., readout data), the CPU 100 need only perform a rewrite to "0", and executes only a simultaneous erase at addresses 0 and 1, as described in the first embodiment.

When data to be written at address 0 of page 2 represents only a rewrite from "0" to "1" with respect to current data stored at address 0 of page 2, and data to be written at address 1 of page 2 represents only a rewrite from "0" to "1" with respect to current data stored at address 1 of page 2, the CPU 100 need only perform a rewrite to "1", and executes only a simultaneous write at addresses 0 and 1 described above.

In this manner, in a data rewrite from "1" to "0" or from "0" to "1", the CPU 100 need only perform an erase or write to shorten the rewrite time.

Note that data may be erased/written from/at one address in units of bytes.

In the above embodiments, circuits such as the memory cell array 1 and write data latch circuits 5 are arranged in units of bits 0 to 7, and the circuit corresponding to each bit has an arrangement corresponding to addresses 0 to F. This layout is employed for wiring convenience, and circuits may be arranged in units of addresses 0 to F.

As has been described above, according to the present invention, the data setting means inverts input data in the erase mode, and directly outputs input data in the write mode. After the data latch means sequentially latches data corresponding to input data to a plurality of addresses, the control means outputs a start signal to select a word line by the row selection means and a digit line by the write means. Data can be simultaneously rewritten in memory cells at a plurality of addresses. As a result, data can be rewritten at a plurality of addresses within almost the same time as the conventional data rewrite time for one address, thereby greatly shortening the rewrite time.

Data is erased/written by selecting only a memory cell at a bit and address corresponding to a latch circuit in which a predetermined value (e.g., "1") is written out of the latch circuits of the data latch means. No data is erased/written in a memory cell at a bit and address corresponding to a latch circuit in which a value (e.g., "0") other than the predetermined value is written. This can decrease the number of rewrite operations with respect to the memory cell and increase the service life of the memory cell.

In a data rewrite from "1" to "0", only an erase can be executed to shorten the data rewrite time.

In a data rewrite from "0" to "1", only a write can be executed to shorten the data rewrite time.

What is claimed is:

1. A nonvolatile semiconductor memory device comprising:

a memory cell array in which a plurality of memory cells corresponding to pluralities of bits, pages, and addresses are arranged in a matrix;

a plurality of word lines each commonly connected to the memory cells of a corresponding page;

a plurality of digit lines each commonly connected to the memory cells of a corresponding bit and address;

data setting means for inverting input data of a plurality of bits in an erase mode and directly outputting input data in a write mode;

data latch means for latching data output from said data setting means in correspondence with a bit and address designated by an address signal;

row selection means for selecting a word line corresponding to a page designated by an address signal out of said word lines upon reception of a simultaneous write start signal;

write means for selecting a digit line in accordance with an output from said data latch means upon reception of the simultaneous write start signal; and control means for reading out data in accordance with an external instruction, controlling the write and erase modes, and outputting the simultaneous write start signal after input data to a plurality of addresses are sequentially latched by said data latch means.

2. A nonvolatile semiconductor memory device according to claim 1, wherein said data latch means comprises a plurality of latch circuits corresponding to bits and addresses.

3. A nonvolatile semiconductor memory device according to claim 2, wherein said write means selects, from said digit lines, a digit line corresponding to a bit and address indicated by a latch circuit which holds a predetermined value.

4. A nonvolatile semiconductor memory device according to claim 1, further comprising designation means for supplying an external instruction for designating only an erase to said control means in a data rewrite from "1" to "0".

5. A nonvolatile semiconductor memory device according to claim 1, further comprising designation means for supplying an external instruction for designating only a write to said control means in a data rewrite from "0" to "1".

6. A nonvolatile semiconductor memory device according to claim 1, wherein said control means outputs a write/erase mode selection signal, a simultaneous write signal, a read mode selection signal, and the simultaneous write start signal to said row selection means and said write means in accordance with an external instruction.

* * * * *